United States Patent [19]

Traylor

[11] Patent Number: 5,301,141
[45] Date of Patent: Apr. 5, 1994

[54] DATA FLOW COMPUTER WITH AN ARTICULATED FIRST-IN-FIRST-OUT CONTENT ADDRESSABLE MEMORY

[75] Inventor: Rober L. Traylor, Hillsboro, Oreg.
[73] Assignee: Intel Corporation, Santa Clara, Calif.
[21] Appl. No.: 877,471
[22] Filed: May 1, 1992
[51] Int. Cl.$^5$ ............................................. G11C 15/00
[52] U.S. Cl. .................................................... 365/49
[58] Field of Search ................. 365/49, 150, 190, 154, 365/221, 78

[56] References Cited

U.S. PATENT DOCUMENTS

| | | | |
|---|---|---|---|
| 4,723,224 | 2/1988 | Van Hulett et al. | 365/49 |
| 4,725,981 | 2/1988 | Rutledge | 365/154 |
| 4,873,665 | 10/1989 | Jiang et al. | 365/154 |

Primary Examiner—Eugene R. LaRoche
Assistant Examiner—Frank Niranjan
Attorney, Agent, or Firm—Blakely, Sokoloff, Taylor & Zafman

[57] ABSTRACT

A memory stores data in a first-in-first-out order and associatively matches an incoming datum with the stored data. The stored data includes a first datum and a second datum stored following the first datum. The memory includes a data storage cell which comprises a memory cell coupled to a bit line and a word line. The memory cell stores the first datum. The memory cell can be accessed through the bit line and the word line for read and write operation. The memory cell includes a first half and a second half connected to each other. An exclusive NOR gate circuit is coupled to an output of the memory cell and the bit line for associatively comparing the first datum stored in the memory cell with an incoming datum along the bit line. The exclusive NOR gate circuit outputs a match signal when the incoming datum matches the first datum. A transistor circuit is coupled to the memory cell for disconnecting the first half from the second half under the control of a control signal coupled to the transistor circuit such that the first half retains the first datum and the second half is freed to receive the second datum through a pass transistor. When the transistor circuit connects the first half and the second half into the memory cell under the control of the control signal, the memory cell then stores the second datum. The data storage cell preserves the first-in-first-out order of the memory when the first datum is taken out of the data storage cell. The associative memory formed by a plurality of the data storage cells is also described.

23 Claims, 9 Drawing Sheets

DATA FLOW COMPUTER WITH AN ARTICULATED FIRST-IN-FIRST-OUT CONTENT ADDRESSABLE MEMORY

FIELD OF THE INVENTION

The present invention pertains to the field of high speed computers. More particularly, this invention relates to a high speed data flow computer with an articulated first-in first-out content addressable memory ("AFCAM"), wherein the AFCAM stores data in first-in first-out ("FIFO") order and performs an associative matching operation of its stored data with an incoming data.

BACKGROUND OF THE INVENTION

In the field of supercomputer development, efforts have been made to develop various types of high speed computers that can deliver extremely high levels of performance. One type of such high speed computers employ a data flow concept and are therefore referred to as data flow computers.

Data flow computers have architectures that are completely different from the architectures of conventional control flow computers. In a data flow computer the sequence in which instructions are executed (i.e., instruction sequencing) is solely based upon the availability of data. In other words, an instruction is enabled or executed when all of its operands are available. This is in contrast to a typical control flow computer in which instructions are executed when "pointed to" by the contents of a centralized program counter. The flow of control travels from one instruction to the "next" instruction as directed by the program counter in the control flow computer. In a data flow computer, however, the flow of control is exactly the path that the data travels.

Another aspect of the data flow computer is that there is no concept of storage or memory for variables in the data flow computer although some form of storage is still provided. The elimination of the storage prevents the use of shared variables. This restriction thus keeps the instruction sequencing tied solely to data dependency and independent of any time ordering.

Various models have been developed for data flow computers. One prior model of data flow computer employed a tagged token data-flow architecture ("TTDA"). In a prior tagged token data flow TTDA computer, data is carried in the form of a token. Each token is tagged with an identifier that indicates its logical ordering. Instruction sequencing is determined by associatively matching data-bearing tokens in a waiting-matching unit. In the prior TTDA computer, a waiting-matching unit (i.e., W-M unit) is provided in each of a plurality of processing elements (i.e., PEs). The W-M unit is an associative memory with a controller. The W-M unit matches tokens with identical tags and stores tokens whose mates have not yet arrived. When an incoming token arrives at a W-M unit of a PE, the tag of the token is associatively compared with all the previously unmatched tokens stored in the W-M unit. If the tag of the incoming token matches the tag of a stored token, the stored token is extracted from the associative memory and the data portions of both matching tokens are delivered to an arithmetic logic unit ("ALU"). The storage location in the associative memory for the matching stored token is then free to store another incoming token. If a match does not occur for the incoming token, the token is then stored in the W-M unit.

The W-M unit typically needs to have relatively large storage capacity. This is due to the fact that a token stored in the W-M unit is removed only when matched to an incoming token. If the W-M unit becomes completely filled with unmatched tokens, the computer will immediately deadlock.

The speed of the W-M unit should typically match the computation speed of the ALU in order not to cause the ALU to wait for matched token pairs. Since the most often executed arithmetic instructions typically require two operands, the speed of the W-M unit is required to be twice of that of the ALU.

FIG. 1 illustrates a prior content addressable and reentrant memory (CARM) cell 10 used in the associative memory of a prior waiting-matching unit of a data flow computer. Typically, the associative memory of the prior W-M unit includes a plurality of such CARM cells arranged in an array. The unmatched tokens are stored initially in an ordered sequence. Once a match occurs, the matched token is fetched out and its memory location is freed to store a next unmatched incoming token. This action destroys the time ordering of the stored tokens. The associative memory is content addressable.

In FIG. 1, transistors 11 through 16 form a random access memory (RAM) cell 25. Transistors 11 and 12 are P-channel transistors and transistors 13-16 are N-channel transistors. Transistors 17 through 20 form a CMOS exclusive NOR gate circuit 27. RAM cell 25 is coupled to a word line 28 and bit lines 24 and 26. Bit lines 24 and 26 are driven in a complementary fashion. Exclusive NOR gate circuit 27 is coupled to a sense line 22 and to RAM cell 25. Exclusive NOR gate circuit 27 is used to perform the bit-wise associative comparison.

During a typical read or write operation, CARM cell 10 operates as a typical RAM cell. Word line 28 is asserted and bit lines 24 and 26 are sensed or driven to read or write RAM cell 25.

During an associative comparison, sense line 22 is charged to the power supply Vdd potential. Bit lines 24 and 26 are driven from a data register (not shown) by a bit of a data as in a write operation. Word line 28 is, however, kept at logical low voltage, thus turning off transistors 15 and 16. This preserves the content stored in cell 25 during the associative comparison. If the content stored in cell 25 does not match the bit information driven on bit lines 24 and 26, either transistors 17 and 19 or transistors 18 and 20 of exclusive NOR gate circuit 27 conduct to discharge sense line 22 to ground. If a match occurs, sense line 22 maintains the Vdd voltage.

When a match occurs for all cells along word line 28 driven by all bits of a data stored in the data register, sense line 22 maintains the Vdd voltage. This indicates a match between the data in the data register and the data word along word line 28. The address of the matching data word is then applied to external circuitry.

Disadvantages are however, associated with the W-M unit of a data flow computer employing the prior CARM cells. One disadvantage associated is that the prior associative memory comprising the CARM cells does not maintain the FIFO logic ordering of the stored tokens upon a successful associative comparison operation. When an incoming token is associatively matched with a stored token in the prior associative memory, the stored token is fetched out for execution with the incoming token and the location is freed to store other incoming tokens that have not found their mates in the associative memory. When an unmatched incoming token is stored in that location, the FIFO ordering of the stored tokens is therefore destroyed.

In order to maintain the FIFO ordering of the remaining stored tokens in the W-M unit, the prior associative memory would need to reorganize the remaining stored tokens after each successful associative matching operation. This would involve the operation of shifting the next succeeding younger token into the freed memory location. The same shifting process repeats until there is no freed memory location between two stored tokens. This takes a large amount of time when the storage capacity of the associative memory is relatively large, which in turn slows the speed performance of the W-M unit.

Another disadvantage of the prior associative memory is its need to output the address of the matched data values, not the data values associated with the matched token. This necessitates another random access memory be used to hold the data values. This typically incurs further delays in receiving the matched data values because of the additional access time of the second memory and of delays caused by device input and output buffers.

SUMMARY AND OBJECTS OF THE INVENTION

One of the objects of the present invention is to provide a token caching scheme which maximizes the speed of fully associative token matching while providing a relatively larger token storage capacity.

Another object of the present invention is to provide a token storage which allows associative token matching operation while maintaining the logical ordering of the storage.

Another object of the present invention is to provide a token storage which allows the associative token matching operation to be performed in parallel with a garbage collection operation that maintains the logic ordering of the storage. Furthermore, the garbage collection takes a fixed amount of time (typically two clock cycles) to finish independent of the size of the token stores or of the location of the matched token.

A yet further object of the present invention is to provide an articulated first-in first-out content addressable memory.

A memory stores data in a first-in first-out order and associatively matches an incoming datum with the stored data. The stored data includes a first datum and a second datum stored following the first datum. The memory includes a data storage cell which comprises a memory cell coupled to a bit line and a word line. The memory cell stores the first datum. The memory cell can be accessed through the bit line and the word line for read and write operation. The memory cell includes a first half and a second half connected to each other. An exclusive NOR gate circuit is coupled to an output of the memory cell and the bit line for associatively comparing the first datum stored in the memory cell with an incoming datum along the bit line. The exclusive NOR gate circuit outputs a match signal when the incoming datum matches the first datum. A transistor circuit is coupled to the memory cell for disconnecting the first half from the second half under the control of a control signal coupled to the transistor circuit such that the first half retains the first datum and the second half is freed to receive the second datum through a pass transistor. When the transistor circuit connects the first half and the second half into the memory cell under the control of the control signal, the memory cell then stores the second datum. The data storage cell preserves the first-in first-out order of the memory when the first datum is taken out of the data storage cell.

A memory stores data in a first-in first-out order. The stored data includes a first datum and a second datum stored following the first datum. The memory includes a data storage cell which comprises a memory cell coupled to a bit line and a word line. The memory cell stores the first datum. The memory cell can be accessed through the bit line and the word line for read and write operation. The memory cell includes a first half and a second half connected to each other. A transistor circuit is coupled to the memory cell for disconnecting the first half from the second half under the control of a control signal coupled to the transistor circuit such that the first half retains the first datum and the second half is freed to receive the second datum through a pass transistor. When the transistor circuit connects the first half and the second half into the memory cell under the control of the control signal, the memory cell then stores the second datum. The data storage cell preserves the first-in first-out order of the memory when the first datum is taken out of the data storage cell.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
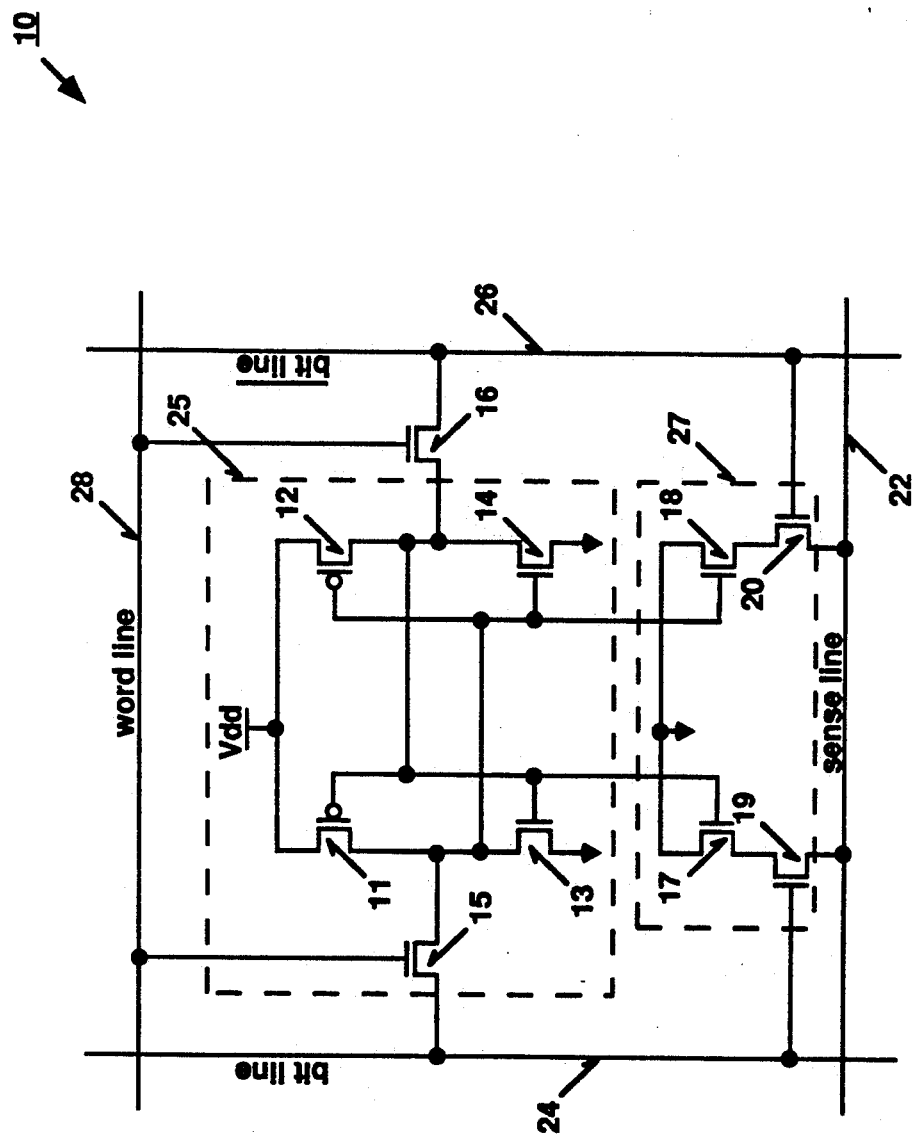
FIG. 1 is a circuit diagram of a prior art CARM cell.
Figure 2:
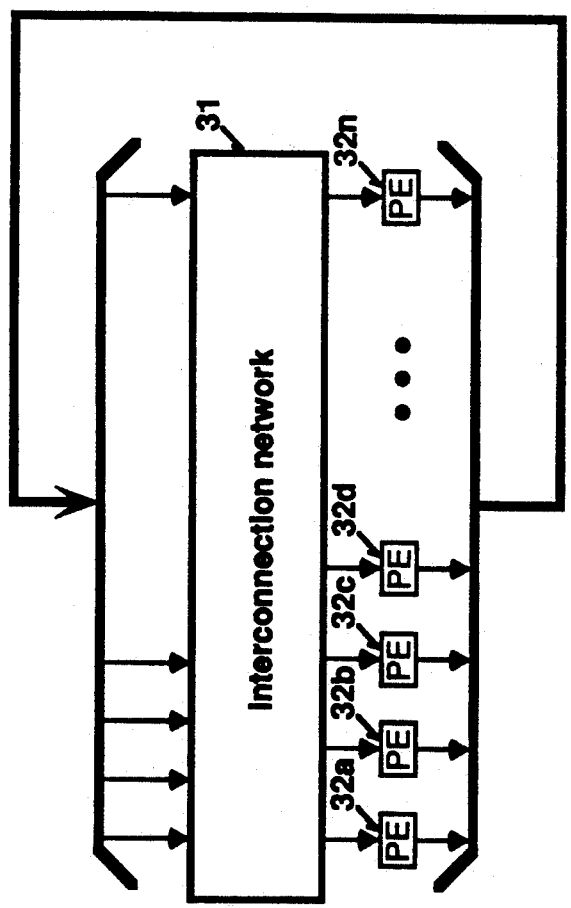
FIG. 2 is a block diagram of a tagged-token data flow computer, including an interconnection network and a plurality of processing elements.

FIG. 2 illustrates in block diagram a tagged-token data-flow architecture ("TTDA") computer 30 that implements a preferred embodiment of the present invention. In FIG. 2, TTDA computer 30 includes an interconnection network 31 and a plurality of processing elements 32a through 32n coupled to interconnection network 31. The outputs of processing elements 32a-32n are then coupled back to interconnection network 31 to form a closed loop.

Processing elements 32a-32n are identical to each other. Each of processing elements 32a-32n constitutes a complete data flow computer which directly executes data flow programs. Each of processing elements 32a-32n includes a waiting-matching unit (i.e., W-M unit) which will be described below. Interconnection network 31 interconnects processing elements 32a-32n. Work is dynamically distributed among processing elements 32a-32n.

Data values (i.e., operands) are carried in TTDA computer 30 by tokens. Each token includes a tag which associates the data that the token carries with an instruction to be executed. The tag of a token includes a context field, an iteration field, an offset field, and a position field. The context field distinguishes its token from tokens of different invocations. The iteration field indicates to which iteration of a loop its token belongs to. The offset field is used to indicate the address of the instruction to be executed. The position field indicates to which input of the instruction the token is destined. An instruction includes two operand inputs in one preferred embodiment.

Instructions in TTDA computer 30 typically include single-operand instructions and dual-operand instructions. A single-operand instruction only requires one token which carries one operand for the instruction execution. A dual-operand instruction requires two tokens that carry two operands for the instruction execution. As will be described below, instruction sequencing for the dual-operand instructions is determined by associatively matching the data-bearing tokens in the W-M unit. At the W-M unit, incoming tokens with matching tags are forwarded to an instruction while non-matching tokens are stored to await their matching partners. The unmatched tokens are stored in the W-M unit according to a first-in first-out ("FIFO") ordering.

As described below, the W-M unit is used to associatively match an incoming token with a stored token with identical tag. The W-M unit also stores the incoming token if none of the stored tokens contains the identical tag. The W-M unit comprises an associative memory that is formed by a plurality of articulated first-in first-out content addressable memory ("AFCAM") cells. Each AFCAM cell includes a random access memory ("RAM") cell that stores a bit of a data. The RAM cell is connected with an exclusive NOR gate circuit. The exclusive NOR gate circuit is used to perform the associative comparison of a bit of an incoming data with the bit stored in the RAM cell. During the associative matching operation, the exclusive NOR gate circuit for each of the AFCAM cells along each word line compares the data bit stored with the bit received on each of the bit lines simultaneously. If a match occurs for a bit stored in a particular cell, the exclusive NOR gate circuit for that particular cell indicates a match.

Each AFCAM cell also includes a transistor circuit having a plurality of transistors controlled by a transfer signal. The transistor circuit for each of the AFCAM cells simultaneously shifts the data stored in its respective cell to a word-adjacent cell during in a garbage collection operation to coalesce memory locations and to preserve the FIFO ordering of the stored data. The garbage collection operation always occurs after a successful associative matching operation in the W-M unit. The transfer signal causes the transistors to break the RAM cell into two storage halves, one for storing the currently stored data bit that can be transferred to an AFCAM cell located below it along the same bit line, the other for receiving a data bit from an AFCAM cell located above it along the same bit line. In this way, the first-in first-out logic order of the stored tokens in the associative memory is preserved when a stored token is fetched out in a successful associative matching operation.

Figure 3:
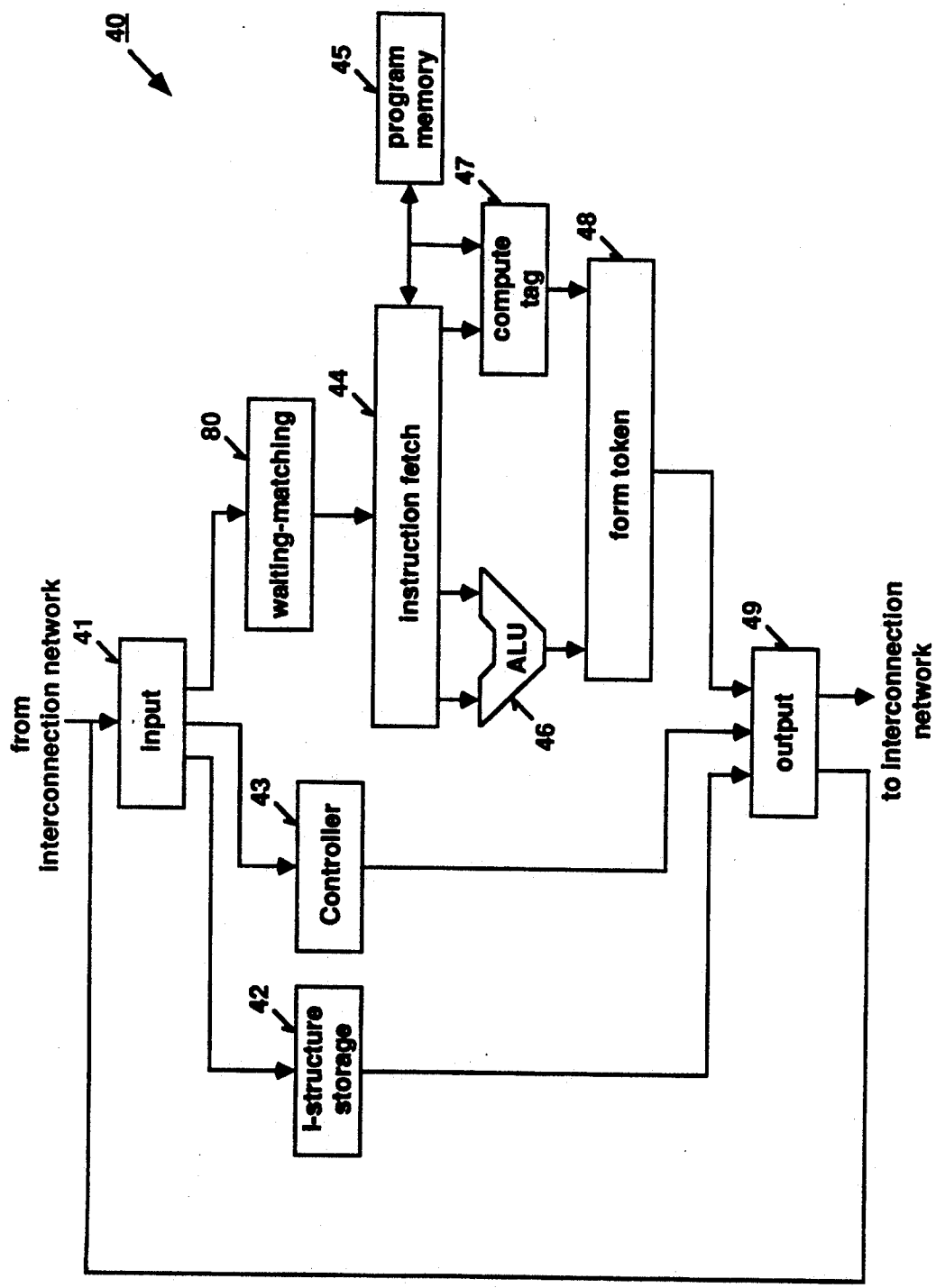
FIG. 3 is a block diagram of one of the processing elements of FIG. 2, including a W-M unit.

FIG. 3 illustrates in block diagram form one processing element 40, according to the preferred embodiment of the present invention. Processing element 40 of FIG. 3 represents any one of processing elements 32a through 32n of FIG. 2.

In FIG. 3, processing element 40 includes an input unit 41, an I-structure storage 42, a controller 43, a W-M (i.e., waiting-matching) unit 80, an instruction fetch unit 44, a program memory 45, an arithmetic logic unit ("ALU") 46, a compute tag unit 47, a form token unit 48, and an output unit 49. In functional terms, I-structure storage 42 provides a storage and manipulation facility for structured data items such as array or records. Controller 43 receives special control tokens which can manipulate the state of processing element 40. These special tokens are typically generated by various operating system resource managers. Controller 43 also controls connections with external circuitry via input and output units 41 and 49.

Instruction fetch unit 44 fetches an instruction stored in program memory 45 addressed by an incoming token or tokens from W-M unit 80. At this time, other data specified by the instruction, such as constants or literals, are also fetched by instruction fetch unit 44. Instruction fetch unit 44 then passes all data to ALU 46 and compute tag unit 47. These include the token data values, any constants or literals, the opcode context and instruction destination addresses.

ALU unit 46 takes the token data values and any constants or literals to compute the result. Compute tag unit 47 uses the context from the tag of the tokens with the instruction destination addresses in the instruction and computes a new tag for the result. The result and the new tag are then passed to form token unit 48.

Form token unit 48 takes the result from ALU unit 46 and attaches the tag sent from compute tag unit 47 to form a new token. The new complete token is then sent to interconnection network 31 (FIG. 2) via output unit 49.

W-M unit 80 is an associative memory and a controller. W-M unit 80 matches tokens with identical tags or stores tokens whose mates have not yet arrived. W-M unit 80 performs an associative matching of an incoming token with the stored tokens. When a match occurs, the stored token with matching tag is extracted from W-M unit 80 and the memory location of the extracted token is then garbage collected in such way that the FIFO ordering for the remaining stored tokens is preserved in W-M unit 80. If not, W-M unit 80 stores the unmatched token in the FIFO order.

W-M unit 80 receives incoming tokens from interconnection network 31 (FIG. 2) via input unit 41. If a token arrives at W-M unit 80 is destined for a single-operand instruction, the token bypasses W-M unit 80 and no associative matching operation is performed for the incoming token. When the token arrived at W-M unit 80 is destined for a dual-operand instruction, W-M unit 80 performs an associative matching operation for the incoming token with all the stored tokens. If a stored token with a matching tag is found, both tokens are passed onto instruction fetch unit 44 and ALU 46 from W-M unit 80. A garbage collection operation is then performed to consume the memory location of the extracted token and to reorganize the remaining stored tokens in W-M unit 80 in order to preserve the FIFO order of the remaining stored tokens in W-M unit 80. If no matching token is found in W-M unit 80, the incoming token is stored in the associative memory of W-M unit 80. The structure and the function of W-M unit 80 will be described in detail below, in conjunction with FIGS. 4–9.

Figure 4:
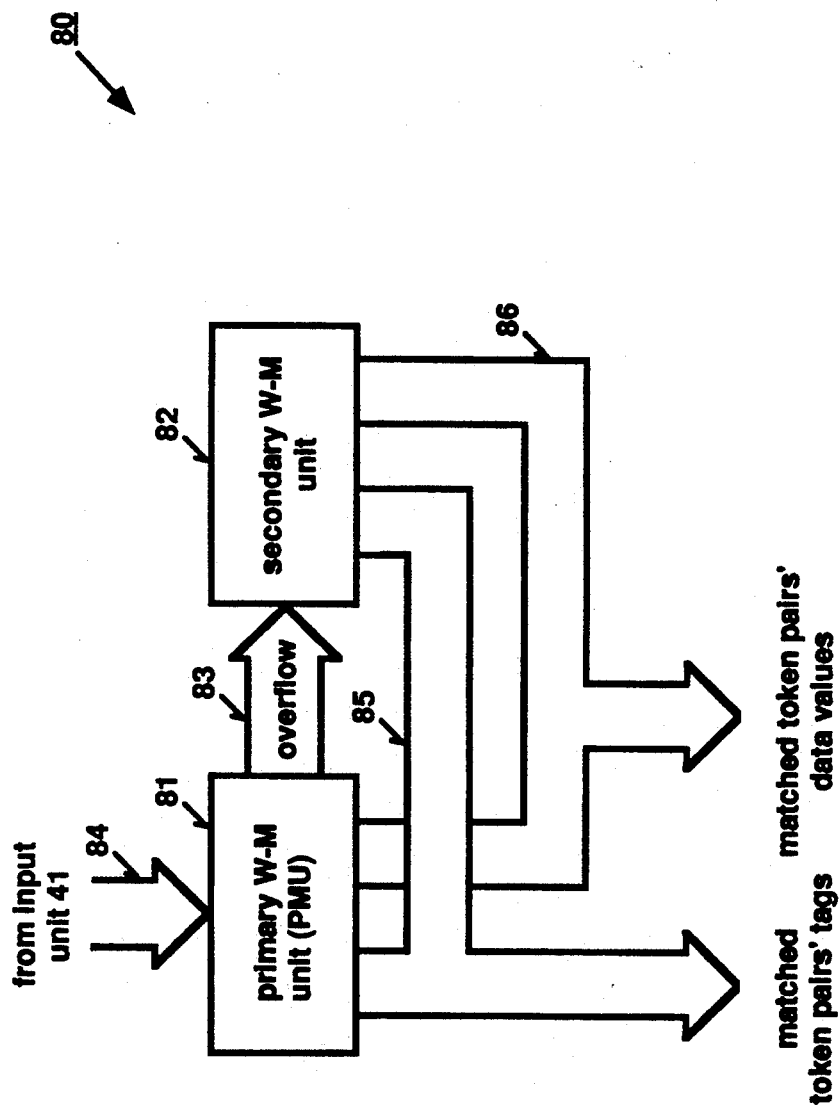
FIG. 4 is a block diagram of the W-M unit of FIG. 3, including a primary W-M unit and a secondary W-M unit.

FIG. 4 illustrates in block diagram W-M unit 80 of FIG. 3, which implements a preferred embodiment of the present invention. In FIG. 4, W-M unit 80 includes a primary W-M unit ("PMU") 81 and a secondary W-M unit 82. PMU 81 is connected to secondary W-M unit 82 via an overflow bus 83. PMU is coupled to receive tokens from input unit 41 (FIG. 3) via bus 84. The outputs of PMU 81 and secondary W-M unit 82 are coupled to instruction fetch unit 44 and ALU 46 (FIG. 3) via buses 85 and 86, respectively. The speed of PMU 81 is faster than secondary W-M unit 82, in one embodiment. Secondary W-M unit 82, however, has a storage capacity larger than that of PMU 81 in that embodiment.

Tokens from input unit 41 first enter PMU 81 via bus 84. PMU 81 acts as a token cache. PMU 81 contains the most recently arrived tokens. In one embodiment, PMU 81 contains 256 most recently arrived tokens. PMU 81 stores the most recently arrived tokens in a first-in first-out ("FIFO") order. PMU 81 shifts the oldest unmatched tokens to secondary W-M unit 82 via overflow bus 83 whenever the storage of PMU 81 becomes full.

During operation, when an incoming token finds its matching token in PMU 81, the data portions of the incoming and stored tokens are passed to ALU 46 (FIG. 3) via bus 86. The matching tag is passed to instruction fetch unit 44 via bus 85. Instruction fetch unit 44 then uses the context and offset contained in the tag to access the instruction to be executed.

PMU 81 then performs a garbage collection operation to consume the freed memory location and to preserve the FIFO ordering on the remaining stored tokens.

If the incoming token does not find its matching token in PMU 81, it is stored in PMU 81 in the FIFO order. Subsequent incoming tokens not matching any stored tokens are also stored in PMU 81 in the FIFO order. As described above, the stored tokens in PMU 81 are arranged in the FIFO order. This process continues until the tag of an incoming token matches that of a stored token or until the storage of PMU 81 is full in which the oldest unmatched token is "retired" to second W-M unit 82 via overflow bus 83 from PMU 81.

Token matching also occurs for tokens stored in secondary W-M unit 82. The results of such a match are also forwarded to instruction fetch unit 44 via bus 85 as well as to ALU 46 via bus 86.

In one embodiment, token matching in secondary W-M unit 82 occurs when a token is "retired" to second W-M unit 82 via overflow bus 83. In another embodiment, when both PMU 81 and secondary W-M unit 82 idle, tokens stored in PMU 81 are checked against tokens stored in secondary W-M 82 for matching partners. If a token in PMU 81 does not find a partner in secondary W-M unit 82, it is marked as checked and the search continues.

Figure 5:
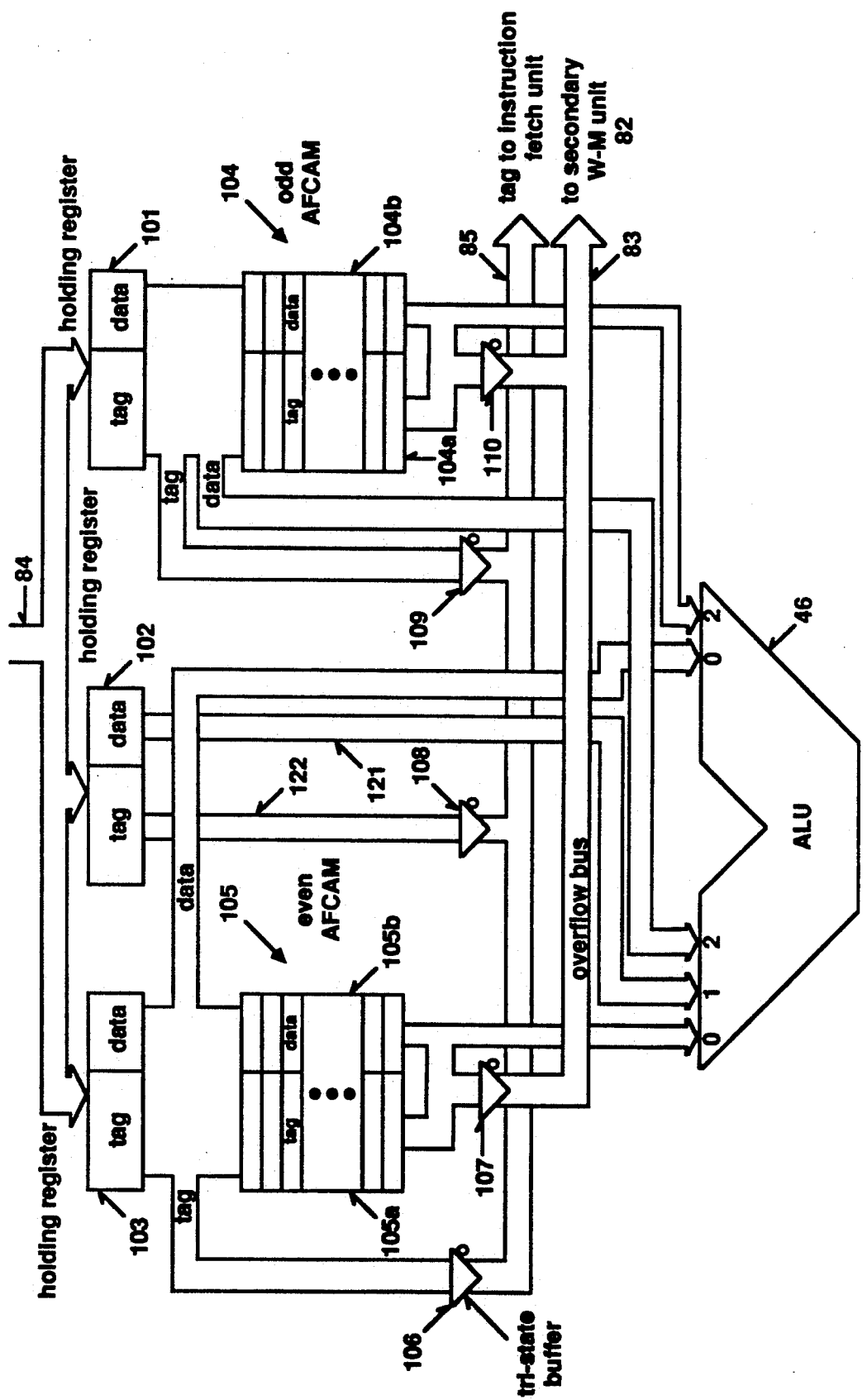
FIG. 5 is a block diagram of the primary W-M unit of FIG. 4, including an odd articulated first-in first-out content addressable memory (AFCAM) and an even AFCAM.

FIG. 5 illustrates in block diagram form of PMU 81 of FIG. 4, which implements the preferred embodiment of the present invention. In FIG. 5, PMU 81 includes an odd AFCAM (i.e., articulated first-in first-out content addressable memory) 104 and an even AFCAM 105. Associated with odd AFCAM 104 is a holding register 101 which receives incoming tokens via bus 84. Associated with even AFCAM 105 is another holding register 103 which also receives incoming tokens via bus 84.

PMU 81 also includes a third holding register 102. Holding register 102 is also coupled to bus 84 for receiving incoming tokens. Holding register 102 only receives tokens that are destined for single-operand instructions. Since these tokens for single-operand instructions do not need partners for instruction execution, holding register 102 directly sends these tokens to instruction fetch unit 44 and ALU 46 via buses 121 and 122. These tokens therefore bypass PMU 81 and undergo no associative matching operations.

In one embodiment, AFCAMs 104 and 105 employ CMOS circuitry. In another embodiment, PMU 81 and ALU 46 reside on the same substrate. In a further embodiment, PMU 81 resides on the same substrate with ALU 46, instruction fetch unit 44, compute tag unit 47 and form token unit 48.

Each of odd and even AFCAMs 104 and 105 includes 128 memory locations, each storing an 80-bit wide token. Each of AFCAMs 104 and 105 includes a tag half and a data half. For example, AFCAM 104 includes tag half 104a and data half 104b. AFCAM 105 includes tag half 105a and date half 105b. The tag half of a memory location stores the tag of a token and the data half stores the data values of the token.

In one embodiment, the tag half of each of AFCAMs 104 and 105 is 48 bits wide and the data half is 32 bits wide.

Figure 6:
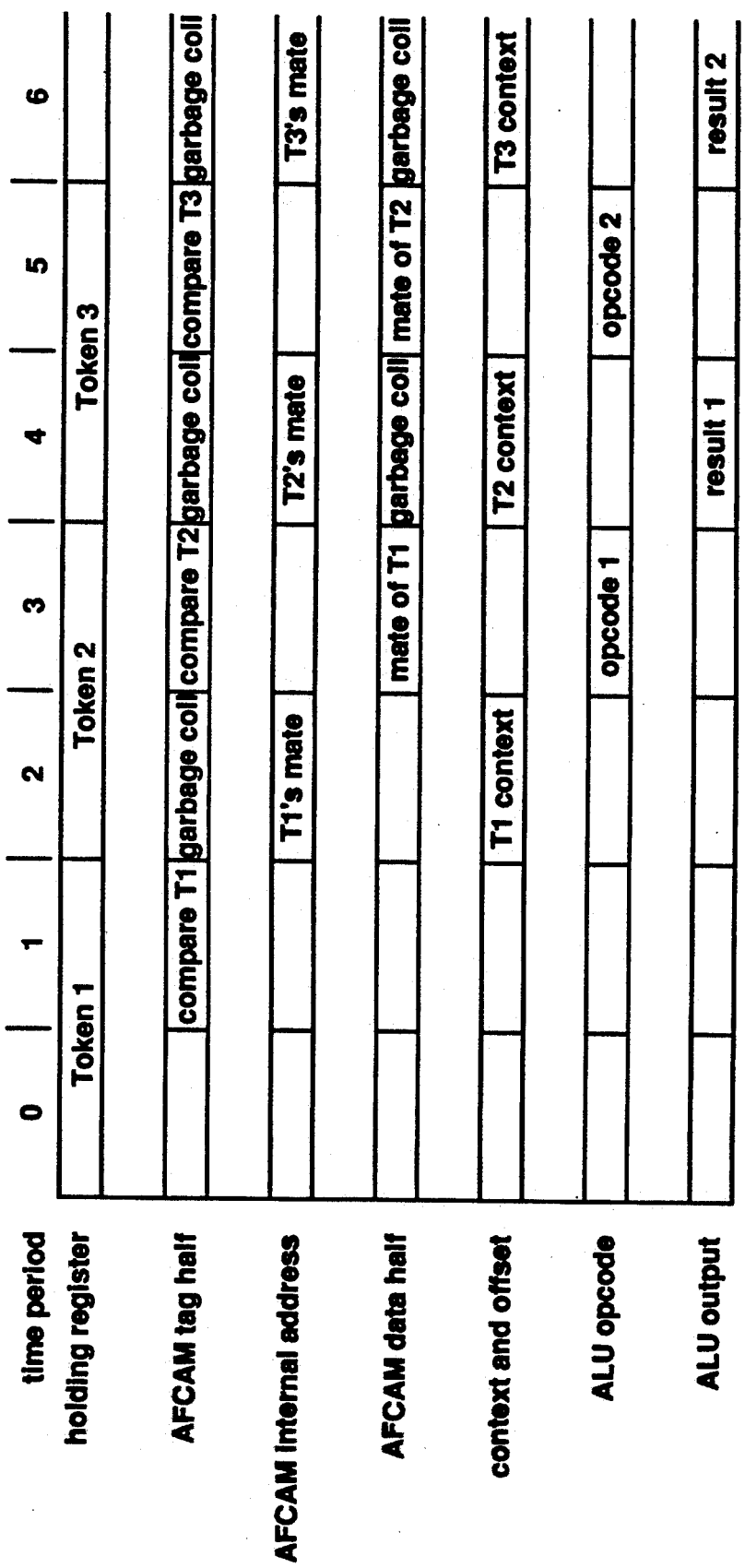
FIG. 6 is a time diagram illustrating the associative token matching operation in the AFCAM of FIG. 5, wherein the tokens shown are all matched tokens.

Incoming tokens are delivered to odd AFCAM 104 or even AFCAM 105 depending upon the least significant bit of the instruction address field of the token. This provides a fair and even distribution of tokens to each of AFCAMs 104 and 105. Each of AFCAMs 104 and 105 provides a matched token pair every two clock cycles. Thus, PMU 81 provides a matched token pair per clock cycle. FIG. 6 illustrates the associative comparison and garbage collection in one of AFCAMs 104 and 105 with respect to the clock cycles, which will be described in detail below.

AFCAMs 104 and 105 each performs an associative matching operation with an incoming token stored in its respective one of holding registers 101 and 103. In other words, AFCAMs 104 and 105 operate in parallel. Registers 101 and 103 each holds an incoming token that is presently looking for its partner stored in the corresponding one of AFCAMs 104 and 105. For example, if holding register 101 receives a token, odd AFCAM 104 then performs an associative comparison operation to look for a stored token that bears the identical tag. The associative comparison is only performed in tag half 104a of odd AFCAM 104. Therefore, the data stored in data half 104b of AFCAM 104 need not be associatively compared. Likewise, if a token is held in holding register 103, tags stored in tag half 105a of even AFCAM 105 are associatively compared with the tag of the token held in register 103 while the data values stored in data half 105b are not associatively compared. The AFCAM cells that form tag halves 104a and 105a of AFCAMs 104 and 105 will be described in detail below, in conjunction with FIG. 9. The memory cells that form data halves 104b and 105b of AFCAMs 104 and 105 will also be described below, in connection to FIG. 9.

During an associative comparison operation in AFCAM 104, for example, the tag of the incoming token held in register 101 is simultaneously compared with the tags of all the tokens stored in tag half 104a of AFCAM 104. When the incoming token has not found a stored token with the identical tag, the incoming token is stored in odd AFCAM 104 in the first-in first-out fashion. When the tag of the incoming token matches the tag of a stored token, the tag stored in holding register 101 is supplied to instruction fetch unit 44 via bus 85 for fetching the instruction for the token pair and the data values in holding register 101 is fed to one input of ALU 46 while the data values of the stored token is fed from data half 104b to another input of ALU 46.

Figure 7:
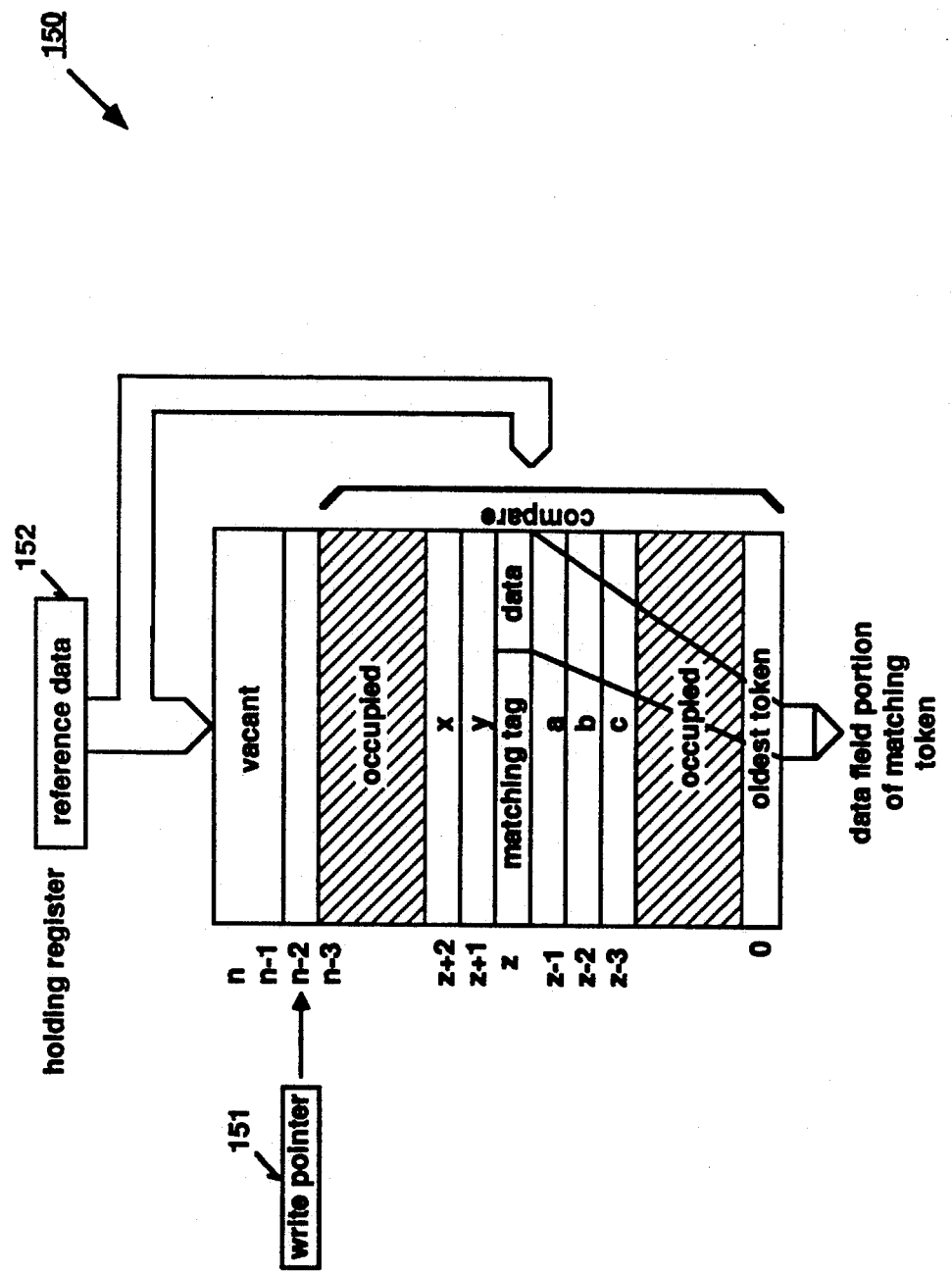
FIGS. 7 and 8 are storage maps of one AFCAM during a matching operation and a garbage collection operation thereafter.
Figure 8:
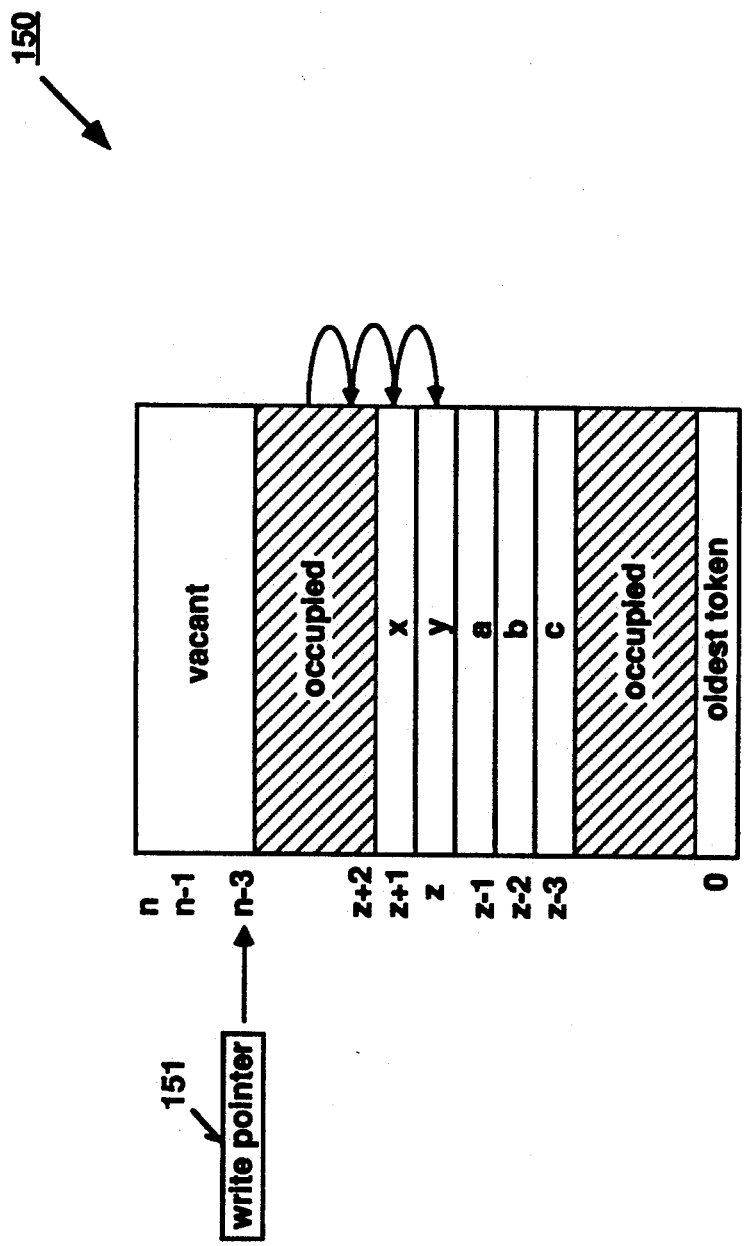

The memory location of the matching token in AFCAM 104 is then garbage collected to preserve the FIFO order for the remaining stored tokens. The garbage collection operation causes the memory location of the matching token to receive and store a next succeeding younger token from a preceding memory location. All other tokens younger than the matching token are also sequentially shifted one position towards the memory location of the matching token to preserve the FIFO order on the remaining stored tokens in AFCAM 104. The sequential shifting for all the tokens younger than the matching token is performed simultaneously in the garbage collection operation. In other words, the garbage collection operation is performed simultaneously with respect to all the younger tokens. FIGS. 7 and 8 illustrate the memory map representation of one of AFCAMs 104 and 105 during the associative matching and garbage collection operation.

Similarly, when holding register 103 holds an incoming token, AFCAM 105 performs the associative matching to look for a stored token with the identical tag. When the incoming token has not found its partner in AFCAM 105, the incoming token is stored in AFCAM 105 in the FIFO fashion. If a match occurs, the tag of the incoming token in holding register 103 is fetched to instruction fetch unit 44 and the data values of the incoming token and the stored token are applied to ALU 46. The memory location is then garbage collected.

When AFCAM 104 or AFCAM 105 begins to overflow, the oldest token is transferred to secondary W-M unit 82 via bus 83.

FIG. 6 illustrates the clock cycles with respect to the operation of the associative matching and garbage collection operation in one of AFCAMs 104 and 105 of FIG. 5. For the illustration purpose, FIG. 6 shows the operation of AFCAM 104, for example, and only illustrates the situations in which incoming tokens are matched tokens.

As can be seen from FIG. 6, AFCAM 104 operates in a pipeline fashion. Tag half 104a of AFCAM 104 starts the associative comparison for token 1 at clock 1. When a match occurs, the tag of token 1 is fetched to instruction fetch unit 44 and the tag half is garbage collected to delete the tag of the matching token of token 1 in the tag half and to preserve the FIFO order for the remaining tags stored in the tag half. At clock 3, the data half is accessed to obtain the data values of the matched token of token 1. During this clock cycle, both operands and the opcode for instruction 1 (i.e., opcode 1) arrive at ALU 46. ALU 46 delivers the result (i.e., result 1) at next clock cycle. Meanwhile, the data half is garbage collected to delete the data values for the matching token of token 1 in the data half and to preserve the FIFO order on the data values of the remaining stored token in the data half of the AFCAM. At clock 3, the tag half also starts the associative comparison for token 2 which overlaps in time with the operation for token 1.

At clock 4, ALU 46 delivers result 1. At clock 6, ALU 46 delivers result 2. Therefore, ALU 46 delivers a result every other clock cycle with one AFCAM. Because PMU 81 of FIG. 5 includes AFCAMs 104 and 105, ALU 46 can deliver a result at every clock cycle.

FIGS. 7 and 8 are the memory map representations of one of AFCAMs 104 and 105 during an associative matching and garbage collection operation. FIG. 7 illustrates the memory map during the associative matching and data fetching operation. FIG. 8 illustrates the memory map during the garbage collection operation.

Referring to FIG. 7, AFCAM 150 represents one of AFCAMs 104 and 105. AFCAM 150 is partially filled. A write pointer 151 points to the next available location $n-2$ for storing unmatched incoming tokens. When an incoming token arrives at holding register 152 which represents one of holding registers 101 and 103, the tag of the incoming token is simultaneously compared against all other tags stored in AFCAM 150. If the incoming token's tag does not match any tag stored in AFCAM 150, the incoming token is then stored in location $n-2$ and the content of pointer 152 is incremented to point to location $n-1$.

If, for example, the tag of the incoming token matches the tag of a token stored in location z, the data of the matching token is fetched out of location z to ALU 46. The tag of the matching token is not needed since an identical tag is stored in holding register 152. Location z is then free to store any other tokens.

Referring to FIG. 8, AFCAM 150 performs the garbage collection operation to consume the freed location z after the successful associative matching operation. During the garbage collection operation, tokens younger than the one stored in location z are shifted towards location z in the same FIFO order to garbage collect the location z. For example, when token y was stored in location $z+1$ and token x was stored in location $z+2$ before the garbage collection, the new location for token y is location z and the new location for token x is location $z+1$ after the garbage collection operation, etc. The content of write pointer 151 is decremented to point to location $n-3$ after the garbage collection operation.

The tokens older than the matched token that are stored in the memory locations below the matched token, however, remain stationary. In this way, the remaining tokens stored in AFCAM 150 remain in the FIFO order. The garbage collection operation is performed to all younger tokens in a single shifting cycle. In this case, token y and token x and all other younger tokens are shifted down one position simultaneously.

When AFCAM 150 is full while an incoming token is required to store in the AFCAM, the token in location 0 (i.e., the oldest token) is output to secondary W-M unit 82. Then all the stored tokens are shifted downwardly towards location 0 freeing location n for the incoming token. The content of pointer 151 is then decremented and the incoming token is written in location n.

Figure 9:
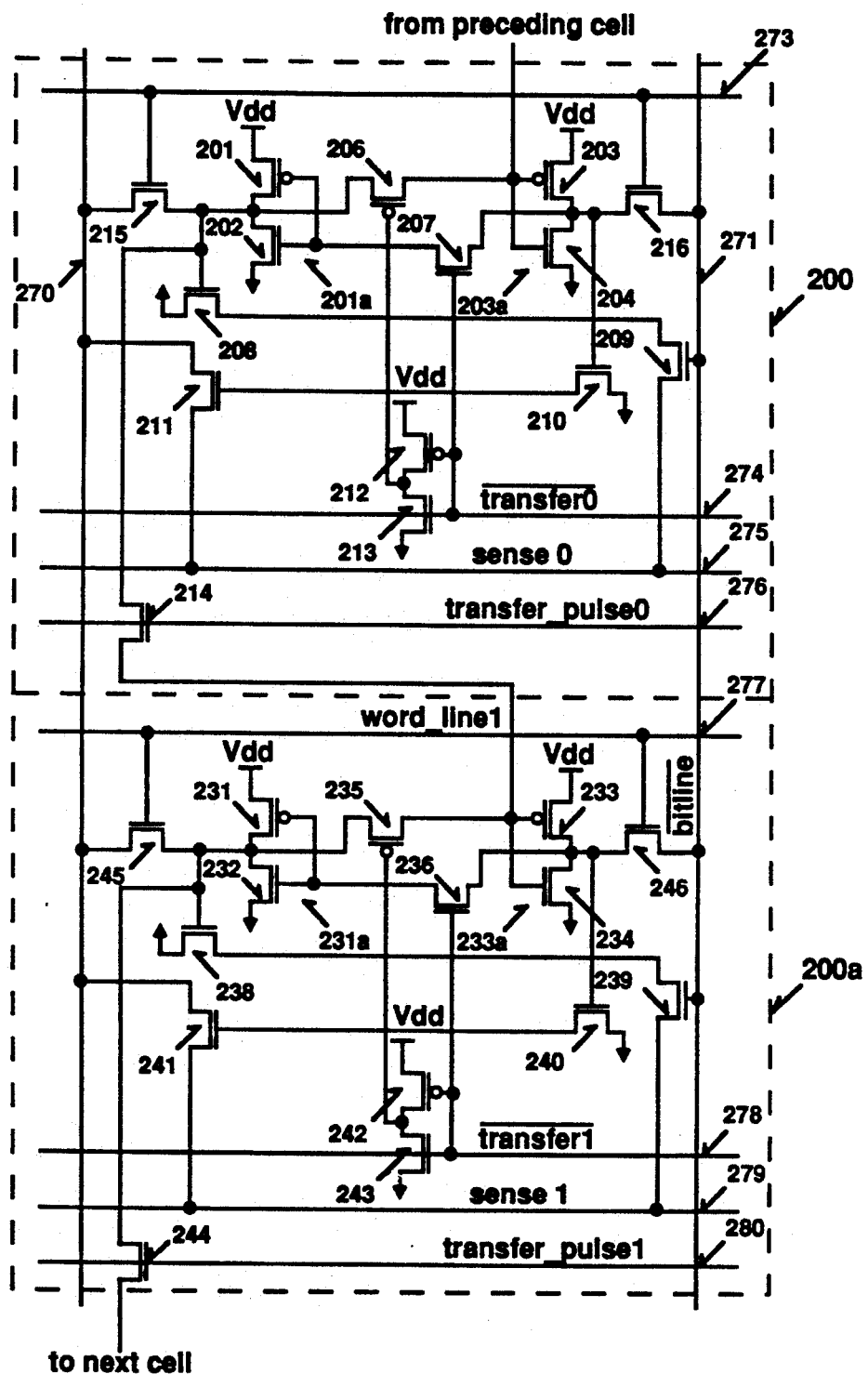
FIG. 9 is a circuit diagram of two identical AFCAM cells employed in the AFCAMs of FIG. 5.

Referring to FIG. 9, the circuits of two identical AFCAM cells 200 and 200a are shown. AFCAM cells 200 and 200a represent two of AFCAM cells that form a column of tag half 104a of AFCAM 104 or tag half 105a of AFCAM 105. AFCAM cells 200 and 200a each implements the preferred embodiment of the present invention.

Referring to FIG. 9, cell 200 includes an SRAM memory cell formed by transistors 201 through 204. Transistor 201-202 form an inverter 201a and transistors 203-204 form another inverter 203a. The two inverters 201a and 203a are cross coupled to form the SRAM cell.

Cell 200 also includes transistors 206 and 207. Transistor 206 couples the input of inverter 203a to the output of inverter 201a. Transistor 207 couples the input of inverter 201a to the output of inverter 203a. Transistor 206 is a P-channel transistor and transistor 207 is an N-channel transistor. When transistors 206 and 207 are on, inverters 201a and 203a are cross coupled. When transistors 206 and 207 are turned off, inverters 201a and 203a are not cross coupled.

The gate of transistor 207 receives a transfer 0 control signal via line 274. The gate of transistor 206 receives the inverted form of the transfer 0 signal from line 274 via an inverter formed by transistors 212 and 213.

The output of inverter 201a is coupled to bit line 270 via transistor 215. The output of inverter 203a is coupled to a bit line 271 via transistor 216. Bit line 271 receives the complementary signal of bit line 270. The gates of transistors 215 and 216 are coupled to word line 273. The function of transistors 215 and 216 is to preserve the data stored in cell 200a during the associative matching operation, or allow storage of new tokens, which will be described below.

Transistors 208 through 211 form an exclusive NOR gate circuit for comparing the content stored in the SRAM cell with an incoming data applied on bit lines 270 and 271. The exclusive NOR gate circuit has its output connected to a sense line 275. The exclusive NOR gate circuit maintains the Vdd voltage on sense line 275 if the data stored in the SRAM cell of cell 200 matches the incoming data on bit lines 270 and 271. The exclusive NOR gate circuit creates a ground path via either transistors 208-209 or transistors 210-211 to discharge the Vdd voltage on sense line 275 when the data stored in cell 200 does not match the incoming data.

The input of inverter 203a is also coupled to a preceding cell via a pass transistor (not shown). The output of inverter 201a is coupled to a cell 200a via another pass transistor 214. Transistor 214 is controlled on and off by a transfer pulse 0 signal at line 276. The function of transistor 214 is to selectively couple the data of cell 200 to cell 200a under the control of the transfer pulse 0 signal.

Transistors 206, 207, and 214 form the transistor circuitry that provides simultaneous shifting mechanism during a garbage collection operation which maintains the FIFO ordering. The operation of the transistor circuitry will be described in detail below.

Similarly, cell 200a includes an SRAM cell formed by transistor 231 through 234. Transistors 231 and 232 form inverter 231a and transistor 233-234 form inverter 233a. Inverters 231a and 233a are cross coupled.

Cell 200a includes transistors 235 and 236 which cross couple inverters 231a and 233a. When transistors 235 and 236 are turned off, inverters 231 and 233a are disconnected. Transistor 236 is an N-channel transistor and receives a transfer 1 signal via line 278 at its gate. Transistor 235 is a P-channel transistor and receives the inverted form of the transfer 1 signal at its gate via an inverter formed by transistors 242 and 243.

Cell 200a includes an exclusive NOR gate circuit formed by transistors 238 through 241. The exclusive NOR gate compares the incoming data applied on bit lines 270 and 271 with the stored data in cell 200a. The output of the exclusive NOR gate circuit is connected to sense line 279. The exclusive NOR gate circuit maintains the Vdd voltage on sense line 279 if the stored data in cell 200a matches the incoming data. The exclusive NOR gate circuit creates a ground path to discharge the Vdd voltage on sense line 279 if the stored data in cell 200a does not match the incoming data.

The output of inverter 231a is coupled to bit line 270 via transistor 245 and the output of inverter 233a is coupled to bit line 271 via transistor 246. The function of transistor 245 and 246 is to preserve the data stored in cell 200a during the associative matching operation, or allow storage of new tokens during a write operation.

The input of inverter 233a is coupled to transistor 214 of cell 200. During the garbage collection operation, transistor 214 can shift the data stored in cell 200 down to cell 200a, which will be described in detail below.

Cell 200a also includes a transistor 244 coupled between the output of inverter 231a and a next cell (not shown) below cell 200a. transistor 244 is controlled on and off by a transfer pulse 1 signal at line 280. The function of transistor 244 is to selectively transfer the data stored in cell 200a to the next cell.

Transistors 235-236 and 244 form the transistor circuitry that provides simultaneous shifting mechanism for cell 200a during a garbage collection operation which maintains the FIFO ordering. The operation of the transistor circuitry will be described in detail below.

During the associative matching operation, when an incoming data is applied on bit lines 270 and 271, it is compared against the data values stored in all cells coupled to bit lines 270-271. Bit lines 270 and 271 receive the data in complementary fashion. In FIG. 9, the data stored in both cells 200 and 200a are thus compared with the incoming data. To accomplish this, word lines 273 and 277 are held at logical low. Transistors 215-216 and 245-246 are turned off. Lines 274 and 278 are held at logical high while lines 276 and 280 are held at logical low. Transistors 206-207 and 235-236 are turned on while transistors 214 and 244 are turned off. Sense lines 275 and 279 are charged (i.e., precharging) to the power supply voltage Vdd. When the incoming data matches the data stored in cell 200, for example, the exclusive NOR gate circuit formed by transistors 208-211 maintains the Vdd voltage on sense line 275. When the incoming data matches the data stored in cell 200a, for example, the exclusive NOR gate circuit formed by transistors 238-241 maintains the Vdd voltage on sense line 279.

Assuming the data stored in cell 200a matches the incoming data on bit lines 270 and 271, sense line 279 is maintained at the logical high state. The sense line drives an address encoder (not shown) to output the address of cell 200a. The address is then applied to a logic circuit (also not shown) for each of word lines 273 and 277. The logic circuit for cell 200a indicates that the matching word is located below or at this location. However, because sense line 279 indicates a match, the logic circuit will output a logical low transfer 1 signal on line 278 while maintaining line 280 at logical low which inhibits the data stored in cell 200a to be shifted to the cell below. The logic circuit for cell 200, however, outputs a logical low transfer 0 signal on line 274 and applies a logical high transfer pulse 0 signal on line 276. The transfer pulse 0 signal is only made logical high during part of the logical low transfer 0 signal period. The logical high transfer pulse 0 signal allows the data stored in cell 200 to be shifted to cell 200a.

Data transfer begins by asserting transfer 0 and transfer 1 signals on lines 274 and 278 to logical low. Transistors 206-207 for cell 200 and transistors 235-236 for cell 200a are turned off, breaking the feedback paths between inverters 201a and 203a and 231a and 233a. This allows each of cells 200 and 200a to hold temporarily two data values. With respect to cell 200, the present data value is stored at inverter 201a. With respect to cell 200a, the present data value is stored at inverter 231a. When the feedback paths are broken, the present state of each inverter is maintained by virtue of the gate capacitance of the input of each inverter.

Next, cell 200 receives a high transfer pulse 0 signal at line 276 to couple the data from cell 200 to cell 200a. The shifted data from cell 200 is stored in inverter 233a. Cell 200a, however, does not receive a high transfer pulse 1 signal at line 280 to shift its data down. This is because cell 200a stores the matched data.

The high transfer pulse 0 signal turns on transistor 214, connecting the output of inverter 201a of cell 200 to the input of inverter 233a of cell 200a. Since the states of inverter 233a is maintained only by its gate capacitance, the output from inverter 201a easily charges or discharges it. At this time, inverter 233a assumes the data of cell 200. Transistor 214 is then turned off before the transfer 0 signal and transfer 1 signal change their state.

Meanwhile, inverter 203a can receive data from its preceding cell at its input if cell 200 does not store the youngest data. The data shifting operation for cell 200 is simultaneously performed with the data shifting from cell 200 to cell 200a.

The transfer 0 and transfer 1 signals are deasserted to turn on transistors 206-207 and 235-236 to reconnect the cross coupled inverters. The correct ordering for closing the feedback paths within cells 200 and 200a is controlled by selecting P-channel transistors for transistors 206 and 235, N-channel transistors for transistors 207 and 236, and using inverters to control transistors 206 and 235.

If a matching cycle does not indicate a match, then the new token must be written into the AFCAM, assuming cell 200 is going to store a bit of the new token. To do this, lines 274 and 276 are held inactive. The level of sense line 275 is immaterial. Transistors 206 and 207 are on and transistor 214 is off. Then, the bit of the token in the holding register drives bit lines 270-271 in a complementary fashion as in the matching operation case. Word line 273 is asserted, turning on transistors 215 and 216. This electrically connects the bit lines 270-271 to inverters 201a and 203a and forces the value of the bit lines 270-271 on the inputs of the inverters. The inverters may be overdriven by the data on the bit lines if the stored value in cell 200 is different.

As described above, data halves 104b and 105b in FIG. 5 are never involved with the matching operation, thus each of the cells that form data halves 104b and 105b does not need the exclusive NOR circuit. But the data must be shifted with the tags. Therefore, the transistor circuit for shifting must be included in each cell.

Therefore, the circuit for a cell in a data half is the same as that of cell 200 or cell 200a except without the exclusive NOR gate circuit.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A data storage cell of a memory, wherein the memory stores data in a first-in first-out order and associatively matches an incoming datum with the stored data, wherein the stored data includes a first datum and a second datum to be stored in the data storage cell following the first datum, wherein the data storage cell comprises:

(A) a memory cell coupled to a bit line and a word line, wherein the memory cell stores the first datum, wherein the memory cell can be accessed through the bit line and the word line for read and write operation, wherein the memory cell includes a first half and a second half connected to each other;

(B) an exclusive NOR gate means coupled to an output of the memory cell and the bit line for associatively comparing the first datum stored in the memory cell with an incoming datum along the bit line, wherein the exclusive NOR gate means outputs a match signal when the incoming datum matches the first datum;

(C) transistor means coupled to the memory cell for disconnecting the first half from the second half under the control of a control signal coupled to the transistor means such that the first half retains the first datum and the second half is freed to receive the second datum through a pass transistor, wherein before the transistor means disconnects the first half from the second half, the first half is electrically connected to the second half via the transistor means, wherein when the transistor means disconnects the first half from the second half, the first half is completely electrically disconnected from the second half, wherein when the transistor means re-connects the first half and the second half together to form the memory cell under the control of the control signal, the memory cell then stores the second datum, wherein the data storage cell preserves the first-in first-out order of the memory when the first datum is taken out of the data storage cell.

2. The data storage cell of claim 1, wherein the memory cell is a random access memory (RAM) cell.

3. The data storage cell of claim 1, wherein the memory cell is a static random access memory (SRAM) cell.

4. The data storage cell of claim 1, wherein the first half of the memory cell comprises a first inverter and the second half of the memory cell comprises a second inverter, wherein the first and second inverters are cross-coupled to form the memory cell, wherein the transistor means comprises a first transistor coupled between an input of the first inverter and an output of the second inverter, and a second transistor coupled between an input of the second inverter and an output of the first inverter, wherein the first and second transistors are turned off by the control signal to disconnect the first inverter from the second inverter.

5. The data storage cell of claim 4, wherein the output of the first inverter is coupled to the output of the memory cell, wherein the transistor means further comprises a third transistor coupled to the output of the memory cell for selectively coupling the first datum to a storage location next to the storage cell under the control of a delayed signal of the control signal when the transistor means disconnects the first half from the second half.

6. The data storage cell of claim 4, wherein the first transistor is an N-channel transistor and the second transistor is a P-channel transistor, wherein the transistor means further comprises an inverter coupled to a gate of the P-channel transistor for providing a complementary signal of the control signal to the P-channel transistor.

7. The data storage cell of claim 4, wherein the input of the second inverter is coupled to the pass transistor for receiving the second datum when the transistor means disconnects the first half from the second half.

8. The data storage cell of claim 1, wherein the transistor means disconnects the first half from the second half when the exclusive NOR gate means outputs the match signal.

9. A data storage cell of a memory, wherein the memory stores data in a first-in first-out order, wherein the stored data includes a first datum and a second datum to be stored in the data storage cell following the first datum, wherein the data storage cell comprises:
(A) a memory cell coupled to a bit line and a word line, wherein the memory cell stores the first datum, wherein the memory cell can be accessed through the bit line and the word line for read and write operation, wherein the memory cell includes a first half and a second half connected to each other; and
(B) transistor means coupled to the memory cell for disconnecting the first half from the second half under the control of a control signal coupled to the transistor means such that the first half retains the first datum and the second half is freed to receive the second datum through a pass transistor, wherein before the transistor means disconnects the first half from the second half, the first half is electrically connected to the second half via the transistor means, wherein when the transistor means disconnects the first half from the second half, the first half is completely electrically disconnected from the second half, wherein when the transistor means re-connects the first half and the second half together to form the memory cell under the control of the control signal, the memory cell then stores the second datum, wherein the data storage cell preserves the first-in first-out order of the memory when the first datum is taken out of the data storage cell.

10. The data storage cell of claim 9, wherein the memory cell is a random access memory (RAM) cell.

11. The data storage cell of claim 9, wherein the memory cell is a static random access memory (SRAM) cell.

12. The data storage cell of claim 9, wherein the first half of the memory cell comprises a first inverter and the second half of the memory cell comprises a second inverter, wherein the first and second inverters are cross-coupled to form the memory cell, wherein the transistor means comprises a first transistor coupled between an input of the first inverter and an output of the second inverter, and a second transistor coupled between an input of the second inverter and an output of the first inverter, wherein the first and second transistors are turned off by the control signal to disconnect the first inverter from the second inverter.

13. The data storage cell of claim 12, wherein the output of the first inverter is coupled to the output of the memory cell, wherein the transistor means further comprises a third transistor coupled to the output of the memory cell for selectively coupling the first datum to a storage location next to the storage cell under the control of a delayed signal of the control signal when the transistor means disconnects the first half with the second half.

14. The data storage cell of claim 12, wherein the first transistor is an N-channel transistor and the second transistor is a P-channel transistor, wherein the transistor means further comprises an inverter coupled to a gate of the P-channel transistor for providing a complementary signal of the control signal to the P-channel transistor.

15. The data storage cell of claim 12, wherein the input of the second inverter is coupled to the pass transistor for receiving the second datum when the transistor means disconnects the first half from the second half.

16. A data storage cell of a memory, wherein the memory stores data in a first-in first-out order and associatively matches an incoming datum with the stored data, wherein the stored data includes a first datum and a second datum to be stored in the data storage cell following the first datum, wherein the data storage cell comprises:
(a) a memory cell comprising
 (i) a first inverter having a first input and a first output;
 (ii) a second inverter having a second input and a second output, wherein the first input of the first inverter is coupled to the second output of the second inverter, wherein the second input of the second inverter is coupled to the first output of the first inverter, wherein the memory cell stores the first datum;
(b) a first transistor coupled between the first output and a first bit line and a second transistor coupled between the second output and a second bit line, wherein the first bit line and the second bit line receive complementary signals, wherein the first and second transistors have their gates coupled to a word line, wherein the first and second transistors are turned off to preserve the first datum from being erased by an incoming datum along the first and second bit lines during an associative matching operation;
(c) an exclusive NOR gate circuit coupled to (i) the first output of the first inverter, (ii) the second output of the second inverter, (iii) the first bit line, and (iv) the second bit line, wherein the exclusive NOR gate circuit generates a match signal when the first datum stored in the random access memory cell matches the incoming datum applied on the first and second bit lines during the associative matching operation;
(d) transistor means comprising
 (i) a third transistor coupled between the first input of the first inverter and the second output of the second inverter;

(ii) a fourth transistor coupled between the second input of the second inverter and the first output of the first inverter, wherein the third and fourth transistors are turned off by a control signal to disconnect the first inverter from the second inverter such that the first inverter retains the first datum and the second inverter is freed to receive the second datum through a pass transistor, wherein the second input of the second inverter of the memory cell is coupled via the pass transistor for receiving the second datum when the third transistor disconnects the second output of the second inverter from the first output of the first inverter and the fourth transistor disconnects the first output of the first inverter from the second input of the second inverter, wherein before the third and fourth transistors are turned off to disconnect (1) the first output of the first inverter from the second input of the second inverter and (2) the second output of the second inverter from the first input of the first inverter, the first inverter is electrically connected to the second inverter via the third and fourth transistors, wherein when the third and fourth transistors are turned off to disconnect the first inverter from the second inverter, the first and second inverters are completely electrically disconnected from each other, wherein when the third and fourth transistors are turned back on by the control signal to re-connect the first inverter and the second inverter together to form the memory cell, the memory cell then stores the second datum; and (iii) a fifth transistor coupled to the first output of the first inverter for selectively coupling the first datum to a storage location next to the storage cell under the control of a delayed signal of the control signal when the transistor means disconnects the first inverter from the second inverter, wherein the data storage cell preserves the first-in first-out order of the memory when the first datum is taken out of the data storage cell.

17. The data storage cell of claim 16, wherein the match signal is a logical high signal.

18. The data storage cell of claim 16, wherein the third and fifth transistors are N-channel transistors and the fourth transistor is a P-channel transistor, wherein the transistor means further comprises an inverter coupled to a gate of the P-channel transistor for providing a complementary signal of the control signal to the P-channel transistor.

19. A storage apparatus that stores data in a first-in first-out order and associatively matches an incoming datum with the stored data, comprising:

(A) a first storage cell coupled to a first bit line and a second bit line and to a first word line for storing information, wherein the first bit line and the second bit line receive complementary signals, wherein the first storage cell comprises (i) a first memory cell coupled to the bit lines and the first word line, wherein the first memory cell can be accessed through the bit lines and the first word line for read and write operation, wherein the first memory cell comprises a first half and a second half connected to each other;

(ii) a first exclusive NOR gate means coupled to a first output of the first memory cell and the bit lines;

(iii) first transistor means coupled to the first memory cell for disconnecting the first half from the second half under the control of a first control signal coupled to the first transistor means;

(B) a second storage cell coupled to the bit lines and a second word line for storing information, comprising (i) a second memory cell coupled to the bit lines and the second word line, wherein the second memory cell can be accessed through the bit lines and the second word line for read and write operation, wherein the second memory cell comprises a third half and a fourth half connected to each other;

(ii) a second exclusive NOR gate means coupled to a second output of the second memory cell and the bit lines;

(iii) second transistor means coupled to the second memory cell for disconnecting the third half from the fourth half under the control of a second control signal coupled to the second transistor means, wherein the second transistor means is coupled to a first input of the second half of the first memory cell;

(C) a third storage cell coupled to the bit lines and a third word line for storing information, comprising (i) a third memory cell coupled to the bit lines and the third word line, wherein the third memory cell can be accessed through the bit lines and the third word line for read and write operation, wherein the third memory cell comprises a fifth half and a sixth half connected to each other;

(ii) a third exclusive NOR gate means coupled to a third output of the third memory cell and the bit lines;

(iii) third transistor means coupled to the third memory cell for disconnecting the fifth half from the sixth half under the control of a third control signal coupled to the third transistor means, wherein the third transistor means is coupled to a second input of the fourth half of the second memory cell, wherein (1) when the first memory cell stores a first datum, the second memory cell stores a second datum, and the third memory cell stores a third datum in the first-in first-out order, and (2) when an incoming datum is applied to the bit lines, then (a) the first exclusive NOR gate means associatively compares the first datum stored in the first memory cell with the incoming datum, (b) the second exclusive NOR gate means associatively compares the second datum stored in the second memory cell with the incoming datum, and (c) the third exclusive NOR gate means associatively compares the third datum stored in the third memory cell with the incoming datum, wherein the first exclusive NOR gate means outputs a match signal when the incoming datum matches the first datum, wherein the second exclusive NOR gate means outputs the match signal when the incoming datum matches the second datum, wherein the third exclusive NOR gate means outputs the match signal when the incoming datum matches the third datum, wherein when the second exclusive NOR gate means outputs the match signal, the second transistor means disconnects the third half and the fourth half under the control of the second control signal and the third transistor means disconnects the fifth half and the sixth half under the control of the third control signal such that the third half retains the second datum and the fifth half retains the third datum while the fourth half is freed to receive the third datum from the fifth half through the third transistor means, wherein before the second transistor means disconnects the third half from the fourth half and the third transistor means disconnects the fifth half from the sixth half, the third half is electrically connected to the fourth half via the second transistor means and the fifth half is electrically connected to the sixth half via the third transistor means, wherein when the second transistor means disconnects the third half from the fourth half and the third transistor means disconnects the fifth half from the sixth half, the third half is completely electrically disconnected from the fourth half and the fifth half is completely electrically disconnected from the sixth half, wherein when the second transistor means re-connects the third half and the fourth half and the third transistor means re-connects the fifth half and the six half, the second memory cell stores the third datum, wherein the storage apparatus preserves the first-in first-out order on the stored data when the second datum is taken out of the storage apparatus.

20. The storage apparatus of claim 19, wherein the first, second and third memory cells are SRAM cells.

21. The storage apparatus of claim 19, wherein the first, second, and third transistor means each comprises a plurality of transistors.

22. The storage apparatus of claim 19, comprising a plurality of storage cells including the first, second, and third storage cells.

23. The storage apparatus of claim 19, wherein the storage apparatus retains the first-in first-out order after any one of the first datum, the second datum, and the third datum is taken out of the storage apparatus.

* * * * *

UNITED STATES PATENT AND TRADEMARK OFFICE
CERTIFICATE OF CORRECTION

PATENT NO. : 5,301,141
DATED : April 5, 1994
INVENTOR(S) : Roger L. Traylor

It is certified that error appears in the above-indentified patent and that said Letters Patent is hereby corrected as shown below:

On the title page item [75] should read:
Roger L. Traylor, Hillsboro, Oreg.

Col. 11, Line 23    Delete "transfer 0"    Insert --transfer 0--

Col. 11, Line 25    Delete "transfer 0"    Insert --transfer 0--

Col. 12, Line 28    Delete "transistor"    Insert --Transistor--

Signed and Sealed this

Twenty-seventh Day of September, 1994

Attest:

BRUCE LEHMAN

*Attesting Officer*         *Commissioner of Patents and Trademarks*